United States Patent
Zhou et al.

(10) Patent No.: US 10,056,437 B2
(45) Date of Patent: Aug. 21, 2018

(54) STEREOSCOPIC IMAGING APPARATUS AND USER TERMINAL

(71) Applicants: Huawei Technologies Co., Ltd., Shenzhen (CN); Cambridge Enterprise Limited, Cambridge (GB)

(72) Inventors: Jiong Zhou, Shenzhen (CN); Kun Li, Cambridge (GB); Daping Chu, Cambridge (GB)

(73) Assignees: Huawei Technologies Co., Ltd., Shenzhen (CN); Cambridge Enterprise Limited, Cambridge (GB)

( * ) Notice: Subject to any disclaimer, the term of this patent is extended or adjusted under 35 U.S.C. 154(b) by 42 days.

(21) Appl. No.: 15/224,212

(22) Filed: Jul. 29, 2016

(65) Prior Publication Data

US 2017/0034503 A1    Feb. 2, 2017

(30) Foreign Application Priority Data

Jul. 30, 2015   (CN) .......................... 2015 1 0458955

(51) Int. Cl.
*G02F 1/1333*   (2006.01)
*G02F 1/1335*   (2006.01)
(Continued)

(52) U.S. Cl.
CPC ........ *H01L 27/322* (2013.01); *G02B 27/2214* (2013.01); *G02F 1/29* (2013.01);
(Continued)

(58) Field of Classification Search
None
See application file for complete search history.

(56) References Cited

U.S. PATENT DOCUMENTS 8,149,342 B2   4/2012   Ijzerman et al.
8,493,440 B2   7/2013   Krijn et al.
(Continued)

FOREIGN PATENT DOCUMENTS

CN   104297929 A   1/2015

OTHER PUBLICATIONS

Fattal et al., "A multi-directional backlight for a wide-angle, glasses-free three-dimensional display," Letter, vol. 495, pp. 348-351, Macmillan Publishers Ltd, London, England (Mar. 21, 2013).

(Continued)

*Primary Examiner* — Ryan Crockett
(74) *Attorney, Agent, or Firm* — Leydig, Voit & Mayer, Ltd.

(57) ABSTRACT

The present invention provides a stereoscopic imaging apparatus (100), including: a display module (130), including a display pixel layer (131) and a first substrate (132), where the display pixel layer (131) includes a pixel array (133), and the first substrate (132) is disposed on the display pixel layer (131); a second substrate (120), disposed opposite to the first substrate (132); and a first lens layer (110), including a lens array (111), where the first lens layer (110) is disposed between the first substrate (132) and the second substrate (120), and the lens array (111) is configured to receive light transmitted by the pixel array (133), and deflect light, which is transmitted by a corresponding pixel in the pixel array (133), to a different projection direction to implement stereoscopic parallax.

17 Claims, 10 Drawing Sheets

(51) Int. Cl.

| | |
|---|---|
| *G02F 1/1343* | (2006.01) |
| *H01L 51/52* | (2006.01) |
| *H01L 27/32* | (2006.01) |
| *G02B 27/22* | (2018.01) |
| *G02F 1/29* | (2006.01) |
| *H04N 13/305* | (2018.01) |

(52) U.S. Cl.
CPC ...... *H01L 27/3211* (2013.01); *H01L 51/5275* (2013.01); *H01L 51/5293* (2013.01); *H04N 13/305* (2018.05); *G02F 1/134309* (2013.01); *H04N 2213/001* (2013.01)

(56) References Cited

U.S. PATENT DOCUMENTS

| | | | |
|---|---|---|---|
| 8,614,771 B2 | 12/2013 | Hong et al. | |
| 8,817,199 B2 | 8/2014 | Guo et al. | |
| 8,836,873 B2 | 9/2014 | Jung et al. | |
| 2002/0012089 A1 | 1/2002 | Inoue et al. | |
| 2004/0004546 A1* | 1/2004 | Ando | E05B 45/06 340/541 |
| 2007/0279365 A1* | 12/2007 | Kageyama | G02B 7/38 345/100 |
| 2008/0316380 A1* | 12/2008 | Ijzerman | G02B 27/2214 349/15 |
| 2012/0075540 A1* | 3/2012 | Chen | G02B 27/26 349/15 |
| 2012/0113336 A1* | 5/2012 | Kim | G02F 1/134363 349/15 |
| 2014/0104518 A1* | 4/2014 | Saitou | G02F 1/1313 349/15 |
| 2014/0104545 A1* | 4/2014 | Miyazawa | G02F 1/133528 349/96 |
| 2014/0361277 A1* | 12/2014 | Lee | H01L 27/323 257/40 |
| 2015/0085214 A1* | 3/2015 | Hayashi | G02F 1/1343 349/15 |
| 2016/0131918 A1 | 5/2016 | Chu et al. | |
| 2017/0315374 A1* | 11/2017 | Zhou | G02B 27/30 |

OTHER PUBLICATIONS

Harrold et al., "Autostereoscopic display technology for mobile 3DTV applications," SPIE Proceedings vol. 6490 (2007).

Li et al., "High quality micro liquid crystal phase lenses for full resolution image steering in auto-stereoscopic displays," Optics Express, vol. 22, No. 18, OSA Publishing (2014).

Dodgson, "Optical devices 3D without the glasses," News & Views, vol. 495, pp. 316-317, Macmillan Publishers Ltd, London, England (Mar. 21, 2013).

Gotchev et al., "Three-Dimensional Media for Mobile Devices," Proceedings of the IEEE, vol. 99, No. 4, pp. 708-741, Institute of Electrical and Electronics Engineers, New York, New York (Apr. 4, 2011).

* cited by examiner

STEREOSCOPIC IMAGING APPARATUS AND USER TERMINAL

CROSS-REFERENCE TO RELATED APPLICATIONS

This application claims the priority of Chinese patent application No. 201510458955.6, filed on Jul. 30, 2015, which is incorporated herein by reference in its entirety.

TECHNICAL FIELD

Embodiments of the present invention relate to the field of display technologies, and more specifically, to a stereoscopic imaging apparatus and a user terminal.

BACKGROUND

Currently, an auto-stereoscopic (auto-stereoscopic) display is also known as a naked-eye two-view display, or a naked-eye three-dimensional display, or a binocular parallax stereoscopic display.

In an existing auto-stereoscopic display, each microlens covers multiple pixels, and generates a stereoscopic image on a central depth plane (central depth plane). A user can see the stereoscopic image when focusing both eyes on the central depth plane.

In addition, a phase feature of an electrically tunable liquid crystal may be used to implement a three-dimensional (Three Dimension, 3D) display technology. For example, the electrically tunable liquid crystal may be fitted closely on an upper side of a screen of existing user equipment. By using a phase feature of the liquid crystal that is electrically live, a liquid crystal lens array is formed, so as to deflect a beam, which is transmitted from pixels of a display of the user equipment, leftward or rightward to implement naked-eye binocular parallax. In this way, a stereoscopic effect is generated in the eyes of an observer.

Generally, an optical distance of at least hundreds of microns exists between an optical plane of the liquid crystal lens array and the display of the user equipment. The display has a relatively wide display angle (for example, possibly wider than 176°). In this way, although strength and contrast of the display deteriorate significantly when the display angle reaches ±30°, light transmitted by one pixel of the display may still cover more than one liquid crystal lens in the liquid crystal lens array. Consequently, a crosstalk (crosstalk) phenomenon may be generated between adjacent pixels. Crosstalk between adjacent pixels significantly reduces a display effect of the display.

SUMMARY

The present invention provides a stereoscopic imaging apparatus and a user terminal, which can reduce impact caused by a phenomenon of crosstalk between pixels of the stereoscopic imaging apparatus, and therefore improve a display effect of the stereoscopic imaging apparatus.

According to a first aspect, a stereoscopic imaging apparatus is provided, including: a display module, including a display pixel layer and a first substrate, where the display pixel layer includes a pixel array, and the first substrate is disposed on the display pixel layer; a second substrate, disposed opposite to the first substrate; and a first lens layer, including a lens array, where the first lens layer is disposed between the first substrate and the second substrate, and the lens array is configured to receive light transmitted by the pixel array, and deflect light, which is transmitted by a corresponding pixel in the pixel array, to a different projection direction to implement stereoscopic parallax.

In a first possible implementation manner, the stereoscopic imaging apparatus is a liquid crystal display LCD, the display module further includes a first polarizer, where the first polarizer is disposed between the first substrate and the first lens layer, and the display pixel layer includes: a second polarizer, a display liquid crystal layer, and a color filter layer, where the color filter layer is disposed between the display liquid crystal layer and the first substrate, and the display liquid crystal layer is disposed between the color filter layer and the second polarizer.

With reference to the first aspect, in a second possible implementation manner, the stereoscopic imaging apparatus is a liquid crystal display LCD, and the display pixel layer includes: a first polarizer, a second polarizer, a display liquid crystal layer, a third substrate, a color filter layer, where the color filter layer is disposed between the first substrate and the third substrate, the third substrate is disposed between the color filter layer and the first polarizer, the display liquid crystal layer is disposed between the first polarizer and the second polarizer, and the color filter layer may form, by using a light energy collection material, a display screen of the stereoscopic imaging apparatus to replenish electrical energy.

With reference to the first aspect, in a third possible implementation manner, the stereoscopic imaging apparatus is an organic light emitting diode OLED display, and the display pixel layer includes: a third substrate and an OLED layer, where the OLED layer is disposed between the third substrate and the first substrate.

With reference to the first aspect or any one of the foregoing possible implementation manners, in a fourth possible implementation manner, the lens array includes a first electrode, an electrode paired with the first electrode, a second electrode, and an electrode paired with the second electrode that are disposed alternately, and a liquid crystal material, and the lens array is configured to receive light transmitted by the pixel array, and control a liquid crystal lens in the lens array to deflect light, which is transmitted by a pixel in the pixel array, to a different projection direction to implement stereoscopic parallax.

With reference to the fourth possible implementation manner, in a fifth possible implementation manner, the first electrode, the electrode paired with the first electrode, the second electrode, and the electrode paired with the second electrode are disposed in parallel on a side that is of the second substrate and close to the liquid crystal material; in a first time segment, a voltage is applied to the first electrode, the electrode paired with the first electrode is grounded, and no voltage is applied to the second electrode and the electrode paired with the second electrode; and in a second time segment, a voltage is applied to the second electrode, the electrode paired with the second electrode is grounded, and no voltage is applied to the first electrode and the electrode paired with the first electrode.

With reference to the fifth possible implementation manner, in a sixth possible implementation manner, the first electrode, the electrode paired with the first electrode, the second electrode, and the electrode paired with the second electrode are disposed on the second substrate horizontally along the stereoscopic imaging apparatus; and when the stereoscopic imaging apparatus is used vertically, the first electrode, the electrode paired with the first electrode, the second electrode, and the electrode paired with the second electrode control the liquid crystal lens in the lens array to deflect the light, which is transmitted by the corresponding pixel in the pixel array, to a different projection direction to implement stereoscopic parallax.

With reference to the sixth possible implementation manner, in a seventh possible implementation manner, the lens array further includes a third electrode, an electrode paired with the third electrode, a fourth electrode, and an electrode paired with the fourth electrode, which are disposed alternately; the third electrode, the electrode paired with the third electrode, the fourth electrode, and the electrode paired with the fourth electrode are disposed on the first substrate vertically along the stereoscopic imaging apparatus; and when the stereoscopic imaging apparatus is used horizontally, the third electrode, the electrode paired with the third electrode, the fourth electrode, and the electrode paired with the fourth electrode control a liquid crystal lens in the lens array to deflect the light, which is transmitted by the corresponding pixel in the pixel array, to a different projection direction to implement stereoscopic parallax.

With reference to the fourth possible implementation manner, in an eighth possible implementation manner, the stereoscopic imaging apparatus further includes a conductive film, the conductive film is grounded, and the conductive film is disposed on a side that is of the first substrate and close to the liquid crystal material; in a first time segment, a voltage is applied to the first electrode and the electrode paired with the first electrode, and no voltage is applied to the second electrode and the electrode paired with the second electrode or the second electrode and the electrode paired with the second electrode are grounded; and in a second time segment, no voltage is applied to the first electrode and the electrode paired with the first electrode or the first electrode and the electrode paired with the first electrode are grounded, and a voltage is applied to the second electrode and the electrode paired with the second electrode.

With reference to the seventh possible implementation manner, in a ninth possible implementation manner, the third electrode, the electrode paired with the third electrode, the fourth electrode, and the electrode paired with the fourth electrode are made of conductive ink.

With reference to the first aspect or any one of the possible implementation manners, in a tenth possible implementation manner, the stereoscopic imaging apparatus according to the first aspect further includes: a touchscreen, disposed on the second substrate; and protective glass, disposed on the touchscreen.

With reference to the first aspect or any one of the possible implementation manners, in an eleventh possible implementation manner, the pixel array includes multiple pixels, the lens array includes multiple first lenses, and each first lens in the multiple first lenses is corresponding to at least one pixel.

With reference to the first aspect or any one of the foregoing possible implementation manners, in a twelfth possible implementation manner, the pixel array includes multiple pixels, the lens array includes multiple first lenses, each pixel in the multiple pixels includes multiple sub-pixels, and each first lens in the multiple first lenses is corresponding to at least one sub-pixel.

With reference to the first possible implementation manner, in a thirteenth possible implementation manner, a thickness of the first substrate is 50-300 microns.

With reference to the second possible implementation manner, in a fourteenth possible implementation manner, the first substrate is protective glass of the color filter layer, and a thickness of the protective glass is 50-300 microns.

With reference to the third possible implementation manner, in a fifteenth possible implementation manner, a thickness of the first substrate is 50-300 microns.

According to a second aspect, a user terminal is provided, including a stereoscopic imaging apparatus according to the first aspect.

Based on the technical solution of the present invention, a lens layer that is configured implement stereoscopic parallax is disposed on a display module, thereby reducing a distance between the lens layer and a display pixel layer in the display module, reducing a scope that is on the lens layer and covered by light transmitted by each pixel in the display pixel layer, reducing impact caused by a phenomenon of crosstalk between pixels, and enhancing an auto-stereoscopic display effect.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

It should be understood that, in an embodiment of the present invention, stereoscopic imaging may refer to three-dimensional display or auto-stereoscopic display. The technical solutions of the present invention are applicable to various stereoscopic imaging displays, and in particular, to a stereoscopic imaging display that uses an electrically tunable liquid crystal technology.

Generally, a lens module that implements auto-stereoscopic display is disposed on a surface of a display of a user terminal. In this way, multiple layers of substrates exist between a lens layer of the lens module and a pixel layer in the display, such as a substrate of a touchscreen of the user terminal and substrates of protective glass and the pixel layer. A thickness of such a substrate is approximately 300 microns. Consequently, regardless of a thickness of a substrate of a lens layer, a distance between the lens layer and the pixel layer exceeds 900 microns. Such a distance leads to the following problems that occur when auto-stereoscopic display is implemented: (1) When a beam emitted by a pixel of the pixel layer arrives at the lens layer, color intensity of the beam decreases significantly, thereby affecting light intensity of an image that arrives at an eye after being deflected by the lens layer; (2) a beam emitted from a pixel of the pixel layer has a specified scattering angle, and a beam emitted by each pixel is scattered onto multiple lens, thereby generating crosstalk; and (3) especially when a mobile phone is used vertically, a vertical distance between a pixel center and a lens center is very short, and a steering angle of an auto-stereoscopic image decreases due to an increase in the distance between the pixel layer and the lens layer, and therefore an observer can enjoy an optimum effect of auto-stereoscopic display only when standing in a distant place.

Figure 1:
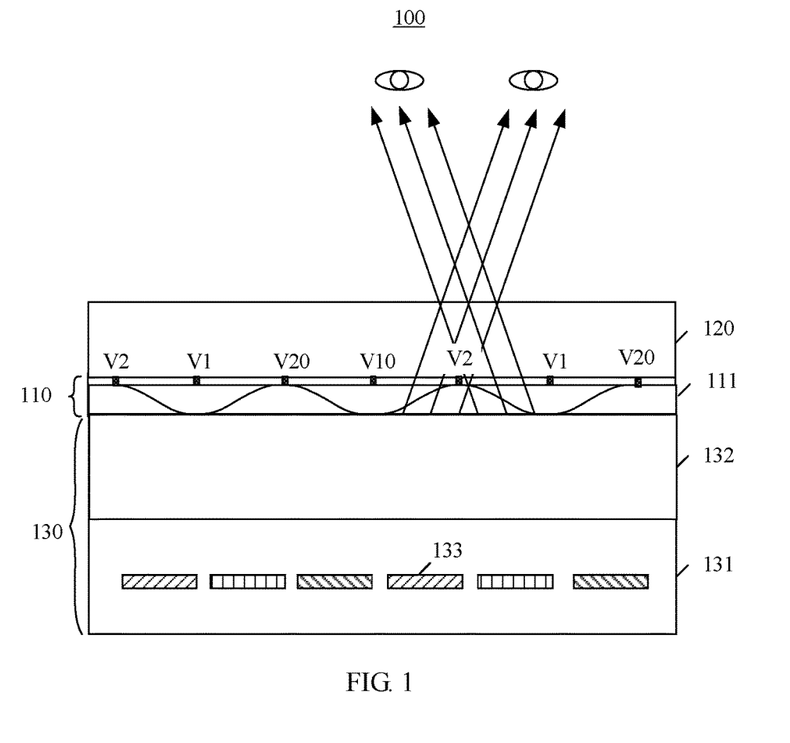
FIG. 1 is a schematic structural diagram of a stereoscopic imaging apparatus according to an embodiment of the present invention.

FIG. 1 is a schematic structural diagram of a stereoscopic imaging apparatus 100 according to an embodiment of the present invention. The stereoscopic imaging apparatus 100 includes: a display module 130, a second substrate 120, and a first lens layer 110.

The display module 130 includes a display pixel layer 131 and a first substrate 132, where the display pixel layer 131 includes a pixel array 133, and the first substrate 132 is disposed on the display pixel layer 131. The second substrate 120 is disposed opposite to the first substrate 132. The first lens layer 110 includes a lens array 111, where the first lens layer 110 is disposed between the first substrate 132 and the second substrate 120, and the lens array 111 is configured to receive light transmitted by the pixel array 133, and deflect light, which is transmitted by a corresponding pixel in the pixel array 133, to a different projection direction to implement stereoscopic parallax.

Specifically, the lens array 111 is superimposed on a position of the pixel array 133, and is configured to deflect light of an image the pixel array 133 of the lens array 111, to a different projection direction. For example, each lens in the lens array 111 may be corresponding to at least one pixel. When auto-stereoscopic display is performed, a beam emitted by a pixel corresponding to a left-eye image may be projected to a left-eye direction of an observer, and a beam emitted by a pixel corresponding to a right-eye image may be projected to a right-eye direction of the observer, thereby implementing the auto-stereoscopic display. In addition, the first lens layer 110 is disposed on the display pixel layer 131, and the first lens layer 110 is separated from the display pixel layer 131 by using the first substrate 132.

According to this embodiment of the present invention, a lens layer that is configured to implement stereoscopic parallax is disposed on a display module, thereby reducing a distance between the lens layer and a display pixel layer in the display module, reducing a scope that is on the lens layer and covered by light transmitted by each pixel in the display pixel layer, reducing impact caused by a phenomenon of crosstalk between pixels, and enhancing an auto-stereoscopic display effect.

The lens layer may be made of a liquid crystal (liquid crystal, LC for short). After an electric field is applied, a liquid crystal can change a refractive index, and different electric fields may be corresponding to different refractive indexes. That is, a liquid crystal is used to form an electrically tunable prism array on the lens layer. When light passes through the liquid crystal to which the electric field is applied, a phase difference of emergent light changes with the externally applied electric field. This embodiment of the present invention is not limited thereto. The lens layer may also be made of another crystal material that can change a refractive index when an electric field is applied, for example, may be made of a lithium niobate crystal. After an electric field is applied, the liquid crystal of each liquid crystal lens is equivalent to a microlens, and multiple microlens form a microlens array.

Observation directions corresponding to different projection directions may include a left-eye observation direction and a right-eye observation direction, but the embodiments of the present invention are not limited thereto, for example, different observation directions may include multiple left-eye observation directions and multiple right-eye observation directions, so that multiple observers can watch an auto-stereoscopic image simultaneously.

In addition, in order that a resolution of a stereoscopic image presented by the stereoscopic imaging apparatus is all pixel units, the electric field applied to the lens layer needs to be enough for deflecting the light of the image, which is displayed by all pixels, to multiple different projection directions within a visual stay time. A time division scheme used by the stereoscopic imaging apparatus when displaying an image photographed from different photographing angles should be corresponding to an electric field that changes in a time division manner and that is applied to the first lens layer, and therefore within the visual stay time, both eyes of each observer in multiple observers see the image of a same scene that is displayed by all pixels in the stereoscopic imaging apparatus and photographed from two photographing angles, which enables multiple observers to observe a high-resolution auto-stereoscopic image from different observation directions.

It should be understood that this embodiment of the present invention is not limited to that all pixels display an image in a same projection direction in a same time segment. For example, in a first time segment, a first part of pixels may display an image in a first projection direction, and a second part of pixels may display an image in a second projection direction; in a second time segment, the first part of pixels may display the image in the second projection direction, and the second part of pixels may display the image in the first projection direction, so long as the image displayed by all pixel units can be observed from different observation directions within the visual stay time of human eyes, that is, so long as a sum of the first time segment and the second time segment is less than the visual stay time of human eyes.

It should be understood that two or three sub-pixels (for example, red, green, and blue sub-pixels) on the display pixel layer may form one display pixel (or image pixel), but this embodiment of the present invention is not limited thereto, for example, one pixel on the display pixel layer may form a display pixel.

According to this embodiment of the present invention, by adjusting a voltage received on an electrode, an electric field may be generated in the lens layer (such as a liquid crystal layer), thereby giving rise to a desired phase configuration for the lens layer. Different phase configurations depend on different voltage configurations and different electrode distribution manners. The electrode may be made of a transparent conductive material, for example, a transparent conductive material such as indium tin oxide (Indium Tin Oxide, ITO for short).

It should be understood that a structure of the display module 131 may vary with a type of the stereoscopic imaging apparatus. For example, when this embodiment of the present invention is applied to an organic light-emitting diode (Organic Light-Emitting Diode, OLED), the display module includes an OLED layer; and when this embodiment of the present invention is applied to a liquid crystal display (Liquid Crystal Display, LCD), the display module includes a liquid crystal layer and a color filter (Color Filter, CF) layer, and two polarizers (polarizer) whose polarization directions are vertical to each other are disposed on both sides of the liquid crystal layer, where the polarizers may be disposed as a part of the stereoscopic imaging apparatus or may be disposed separately, which is not limited by the present invention.

It should be understood that the first substrate may be a substrate of the display pixel layer, or may be a substrate of the first lens layer. In other words, the display pixel layer and the first lens layer may share the first substrate. A thickness of the first substrate may range from 50 microns to 300 microns. The first substrate 132 may be a transparent substrate such as a glass substrate, but this embodiment of the present invention is not limited thereto. The first substrate may also be a substrate made of another transparent material, such as a substrate made of a transparent ceramic material.

According to this embodiment of the present invention, the pixel array 133 may include multiple pixels, the lens array 111 may include multiple first lenses, and each first lens may be corresponding to one or more pixels. For example, when a display screen is used horizontally, each lens may be corresponding to two pixels.

Optionally, in another embodiment, the pixel array 133 may include multiple pixels, the lens array 111 may include multiple first lenses, each pixel in the multiple pixels may further include multiple sub-pixels, and each first lens in the multiple first lenses is corresponding to one or more sub-pixels. For example, when the display screen is used vertically, each pixel may include two sub-pixels, and one lens may be corresponding to two sub-pixels.

It should be understood that this embodiment of the present invention does not limit a correspondence between the lens and the pixel or sub-pixel, and the correspondence between the lens and the pixel or sub-pixel may be set according to a structure of the lens and as required by multiple different observation angles in a space.

Alternatively, in another embodiment, the first lens layer causes a display panel to present a two-dimensional image without applying an electric field.

The lens array 111 includes a first electrode V1, an electrode V10 paired with the V1, a second electrode V2, and an electrode V20 paired with the electrode V2 that are disposed alternately, and a liquid crystal material, and the lens array is configured to receive light transmitted by the pixel array 133, and control a liquid crystal lens in the lens array 111 to deflect light, which is transmitted by a pixel in the pixel array 133, to a different projection direction to implement stereoscopic parallax.

The electrode V1, the electrode V10, the electrode V2, and the electrode V20 are disposed in parallel on a side that is of the second substrate (120) and close to the liquid crystal material; in a first time segment, a voltage is applied to the electrode V1, the electrode V10 is grounded, and no voltage is applied to the electrode V2 and the electrode V20; and in a second time segment, a voltage is applied to the electrode V2, the electrode V20 is grounded, and no voltage is applied to the electrode V1 and the electrode V10.

The stereoscopic imaging apparatus 500 further includes a conductive film, the conductive film is grounded, and the conductive film is disposed on a side that is of the first substrate and close to the liquid crystal material; in a first time segment, a voltage is applied to the first electrode V1 and the electrode V10, and no voltage is applied to the second electrode V2 and the electrode V20 or the second electrode V2 and the electrode V20 are grounded; and in a second time segment, no voltage is applied to the first electrode V1 and the electrode V10 or the first electrode V1 and the electrode V10 are grounded, and a voltage is applied to the second electrode V2 and the electrode V20.

A structure of the liquid crystal lens array may be a vertical alignment (Vertical Alignment, VA) liquid crystal molecule structure, and a drive mode of the other electrodes may be a drive mode based on an in-plane switching (In-Plane Switching, IPS) technology. That is, vertically aligned liquid crystal molecules may be driven under control of an indium-tin oxide (Indium-Tin Oxide, ITO) electrode structure aligned on a substrate (in this embodiment, the second substrate). The liquid crystal lens in the foregoing embodiment may also have a structure in which liquid crystal molecules are aligned in parallel with each other (Planar alignment). In a structure in which the liquid crystal molecules are aligned in parallel with the glass substrate, an ITO coating layer needs to be disposed near the liquid crystal lens layer on the first substrate.

Figure 2:
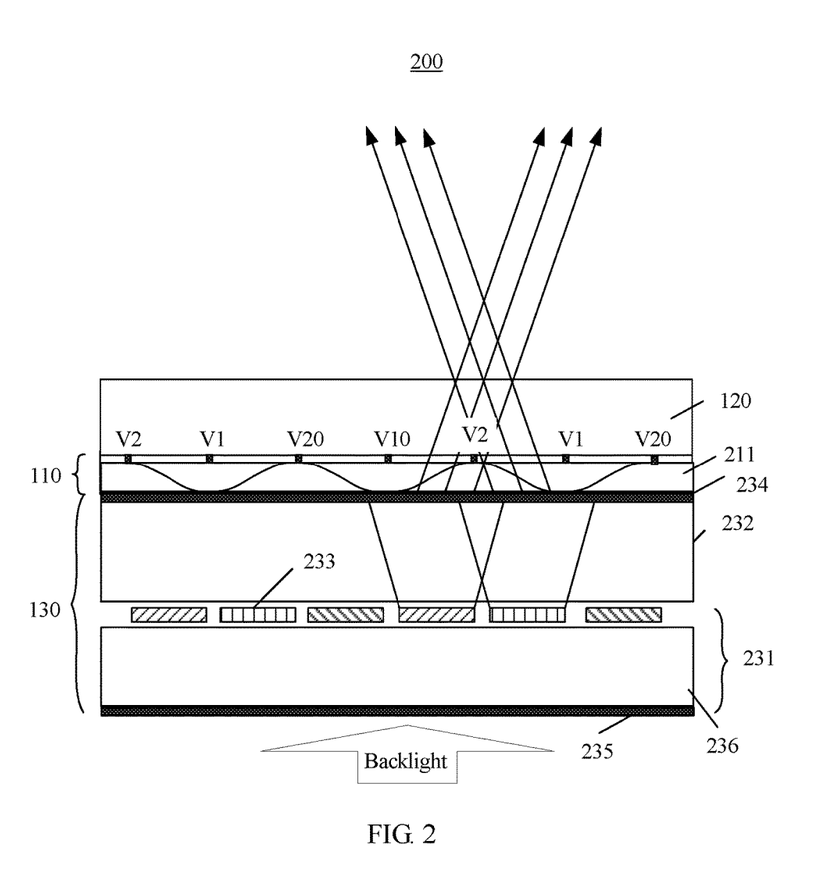
FIG. 2 is a schematic structural diagram of a stereoscopic imaging apparatus according to another embodiment of the present invention.

FIG. 2 is a schematic structural diagram of a stereoscopic imaging apparatus 200 according to another embodiment of the present invention. The stereoscopic imaging apparatus 200 is an example of the stereoscopic imaging apparatus 100, and includes: a display module 130, a second substrate 120, and a first lens layer 110, detailed description of which is omitted herein. The stereoscopic imaging apparatus 200 may be a liquid crystal display LCD.

In this embodiment, the display module 130 includes a first substrate 232, a first polarizer 234, and a display pixel layer 231. The first polarizer 234 is disposed between the first substrate 232 and the first lens layer 110. The display pixel layer 231 includes: a second polarizer 235, a display liquid crystal layer 236, and a color filter layer 233, where the color filter layer 233 is disposed between the display liquid crystal layer 236 and the first substrate 232, and the display liquid crystal layer 236 is disposed between the color filter layer 233 and the second polarizer 235.

In this embodiment, the polarizer of the LCD is disposed on an outermost layer of a backlight outlet and is farthest from a backlight source of the LCD. The first lens layer 110 may be directly disposed at the backlight outlet of a backplane of the LCD. That is, the first polarizer 234 of the LCD may be disposed closely against the first lens layer 110 to serve as a substrate of the first lens layer 110. The lens array of the first lens layer 110 may be a liquid crystal lens array. A structure of the liquid crystal lens array may be a vertical alignment (Vertical Alignment, VA) liquid crystal molecule structure, and a drive mode of the other electrodes may be a drive mode based on an in-plane switching (In-Plane Switching, IPS) technology. That is, vertically aligned liquid crystal molecules may be driven under control of indium-tin oxide (Indium-Tin Oxide, ITO) electrodes aligned on a substrate (in this embodiment, the second substrate). In this way, when the stereoscopic imaging apparatus is being assembled, ITO coating does not need to be performed on the polarizer, which simplifies a process of assembling. The liquid crystal lens array may be driven in the following manner: In a first time segment, a voltage is applied to the electrode V1, the electrode V10 is grounded, and no voltage is applied to the electrode V2 and the electrode V20; and in a second time segment, a voltage is applied to the electrode V2, the electrode V20 is grounded, and no voltage is applied to the electrode V1 and the electrode V10.

Figure 10:
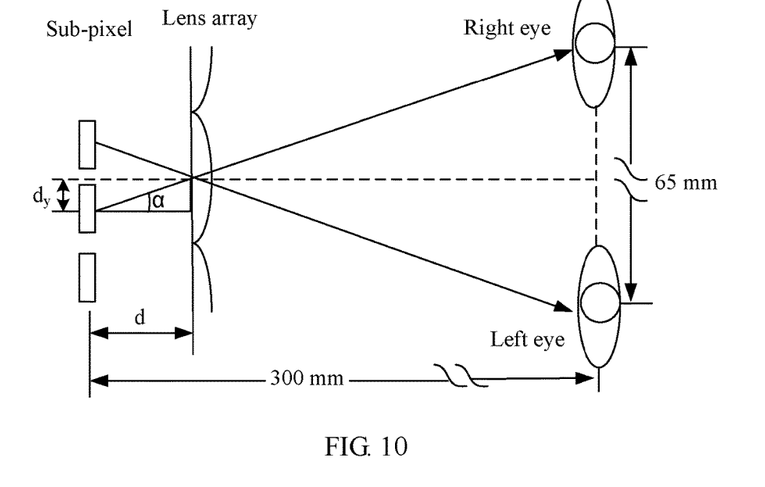
FIG. 10 is a schematic diagram of a position relationship between a display pixel layer, a liquid crystal lens layer, and an observation position.
Figure 11:
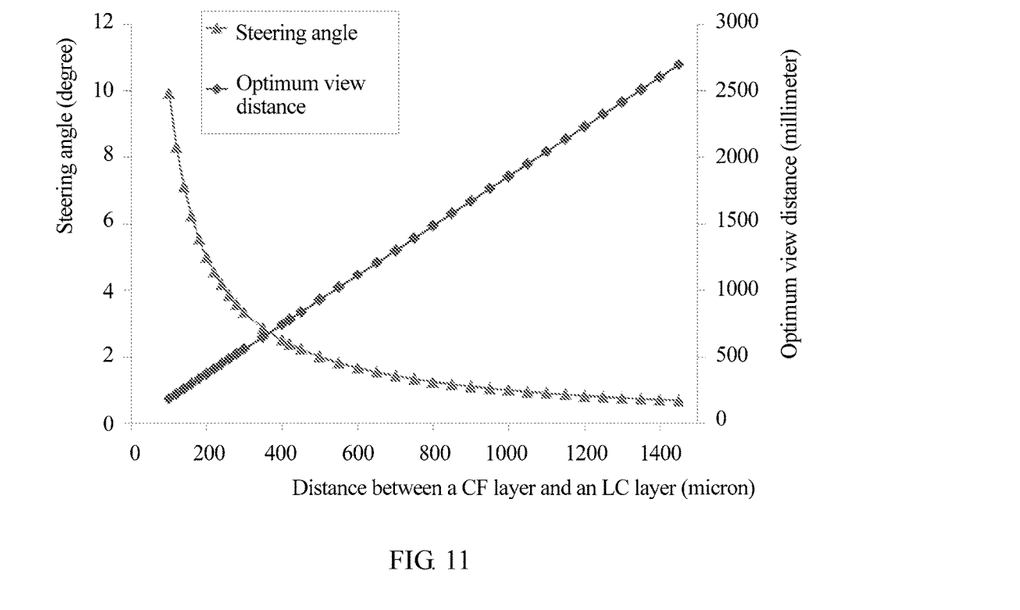
FIG. 11 is a schematic diagram of a relationship of a distance between a liquid crystal lens layer and a display pixel layer, a steering angle of the liquid crystal lens layer, and an optimum view distance.

In this embodiment, the first substrate 232 may be a substrate of the color filter layer 233. Referring to FIG. 10, a thickness of the substrate of the color filter layer 233 is approximately 270 microns. A distance d between the liquid crystal lens layer and the color filter layer may decrease to 270 microns to 280 microns. This distance depends on a thickness of the first polarizer and a thickness of the first substrate. With decrease of the thickness of the substrate of the color filter layer, the distance between the liquid crystal lens layer and the color filter layer may decrease even more. Referring to FIG. 11, compared with a distance of approximately 1.45 mm between the liquid crystal lens layer and the color filter layer in the prior art, the distance between the liquid crystal lens layer and the color filter layer, which is decreased in this embodiment, increases light intensity of sub-pixels on the liquid crystal lens layer to approximately 5 times as much as that in the prior art, decreases a spatial intensity distribution width of the light to approximately ¼ as much as that in the prior art, increases a steering angle α (steering angle) from 0.7° to 3.6°, and may decrease an optimum distance for observing the auto-stereoscopic display from 2700 mm to about 500 mm.

Figure 3:
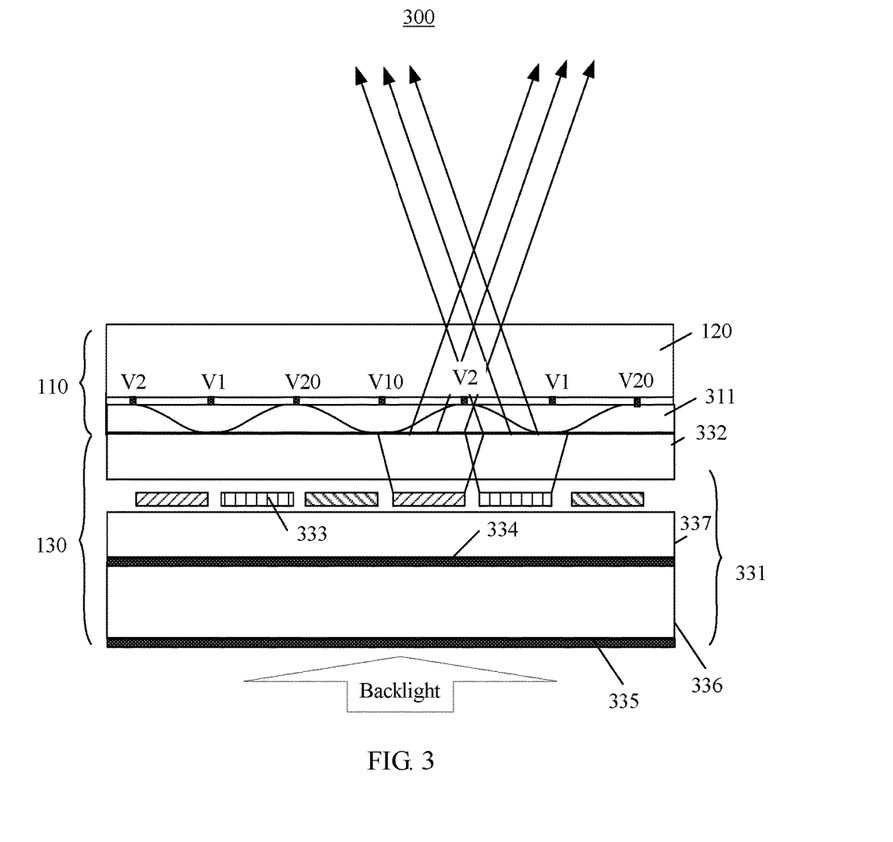
FIG. 3 is a schematic structural diagram of a stereoscopic imaging apparatus according to another embodiment of the present invention.

FIG. 3 is a schematic structural diagram of a stereoscopic imaging apparatus 300 according to another embodiment of the present invention. The stereoscopic imaging apparatus 300 is an example of the stereoscopic imaging apparatus 100, and includes: a display module 130, a second substrate 120, and a first lens layer 110, detailed description of which is omitted herein. The stereoscopic imaging apparatus 300 may be a liquid crystal display LCD.

In this embodiment, the display module 130 includes a first substrate 332 and a display pixel layer 331. The display pixel layer 331 includes: a first polarizer 334, a second polarizer 335, a display liquid crystal layer 336, a third substrate 337, and a color filter layer 333, where the color filter layer 333 is disposed between the first substrate 332 and the third substrate 337, the third substrate 337 is disposed between the color filter layer 333 and the first polarizer 334, and the display liquid crystal layer 336 is disposed between the first polarizer 334 and the second polarizer 335. The color filter layer 333 may form, by using a light energy collection material, a display screen of the stereoscopic imaging apparatus to replenish electrical energy.

In this embodiment, the first substrate 332 may be protective glass of the color filter layer. The protective glass of the color filter layer is disposed on an outermost layer of a backlight outlet and is farthest from a backlight source of the LCD. The first lens layer 110 may be directly disposed at the backlight outlet of a backplane of the LCD. That is, the protective glass of the color filter layer may be disposed closely against the first lens layer 110 to serve as a substrate of the first lens layer 110. The lens array of the first lens layer 110 may be a liquid crystal lens array. A structure of the liquid crystal lens array may be a vertical alignment (Vertical Alignment, VA) liquid crystal molecule structure, and a drive mode of the other electrodes may be a drive mode based on an in-plane switching (In-Plane Switching, IPS) technology. That is, vertically aligned liquid crystal molecules may be driven under control of ITO electrodes aligned on a substrate (in this embodiment, the second substrate). In this way, when the stereoscopic imaging apparatus is being assembled, ITO coating does not need to be performed on the side that is of the first substrate 332 and close to the liquid crystal lens layer, which simplifies a process of assembling. For example, the liquid crystal lens array may be driven in the following manner: In a first time segment, a voltage is applied to the electrode V1, the electrode V10 is grounded, and no voltage is applied to the electrode V2 and the electrode V20; and in a second time segment, a voltage is applied to the electrode V2, the electrode V20 is grounded, and no voltage is applied to the electrode V1 and the electrode V10.

In this embodiment, a thickness of the protective glass of the color filter layer is approximately 50-300 microns, for example, 150 microns. In this way, a distance d between the liquid crystal lens layer and the color filter layer may decrease to 150 microns to 160 microns. This distance depends on the thickness of the protective glass of the color filter layer. With decrease of the thickness of the protective glass of the color filter layer, the distance between the liquid crystal lens layer and the color filter layer may decrease even more. Compared with a distance of approximately 1.45 mm between the liquid crystal lens layer and the color filter layer in the prior art, the distance between the liquid crystal lens layer and the color filter layer, which is decreased in this embodiment, increases light intensity of sub-pixels on the liquid crystal lens layer to approximately 8 times as much as that in the prior art, decreases a spatial intensity distribution width of the light to approximately ⅐ as much as that in the prior art, increases a steering angle α (steering angle) from 0.7° to 6.2°, and may decrease an optimum distance for observing the auto-stereoscopic display from 2700 mm to about 300 mm.

Figure 4:
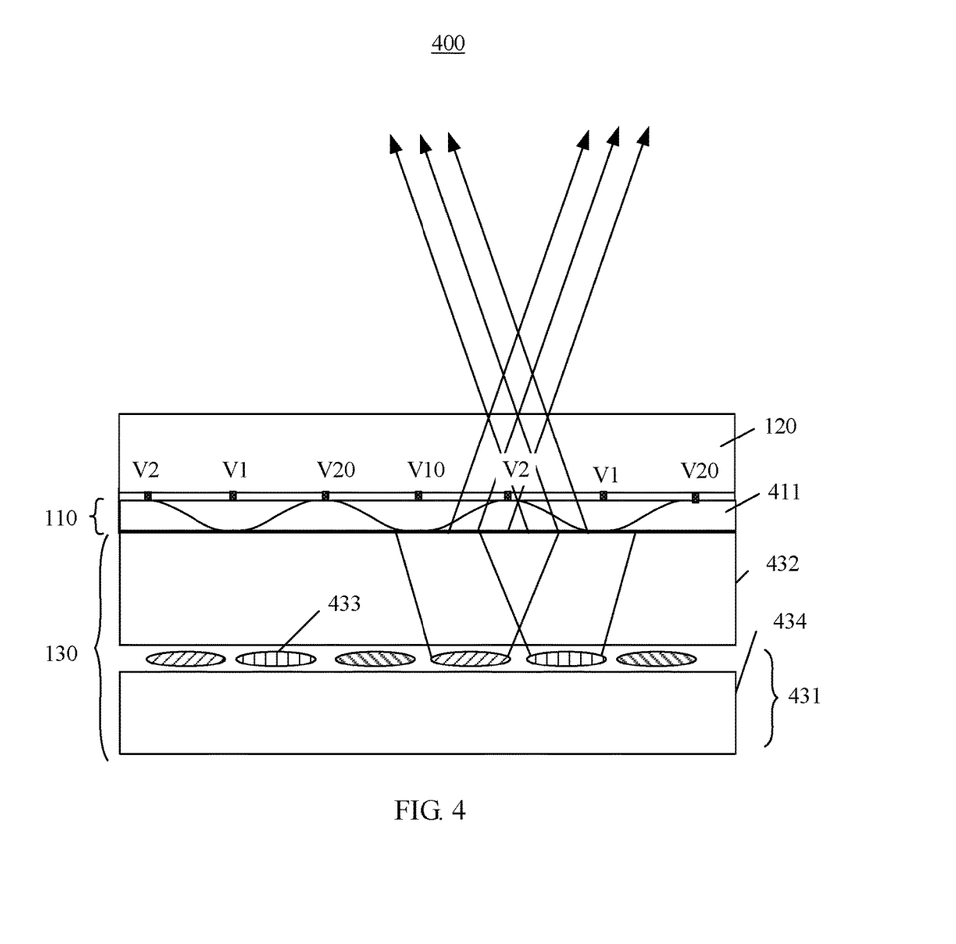
FIG. 4 is a schematic structural diagram of a stereoscopic imaging apparatus according to another embodiment of the present invention.

FIG. 4 is a schematic structural diagram of a stereoscopic imaging apparatus 400 according to another embodiment of the present invention. The stereoscopic imaging apparatus 400 is an example of the stereoscopic imaging apparatus 100, and includes: a display module 130, a second substrate 120, and a first lens layer 110, detailed description of which is omitted herein. The stereoscopic imaging apparatus 400 may be an organic light emitting diode OLED display.

In this embodiment, the display module 130 includes a first substrate 432 and a display pixel layer 431. The display pixel layer 431 includes: a third substrate 434 and an OLED layer 433, where the OLED layer 433 is disposed between the third substrate 434 and the first substrate 432.

In this embodiment, the OLED is a self-luminous component, and different OLEDs can emit light of different colors. Therefore, no backlight or the color filter layer is required. The liquid crystal lens may use a VA structure combined with an IPS drive mode. The VA structure and the IPS drive require no ITO coating layer disposed on the first substrate 432. For example, the liquid crystal lens array may be driven in the following manner: In a first time segment, a voltage is applied to the electrode V1, the electrode V10 is grounded, and no voltage is applied to the electrode V2 and the electrode V20; and in a second time segment, a voltage is applied to the electrode V2, the electrode V20 is grounded, and no voltage is applied to the electrode V1 and the electrode V10.

The first substrate 432 is a bottom glass substrate of the first lens layer, and its thickness is approximately 50-300 microns, such as 150 microns, and may be used as protective glass of the OLED. The glass substrate may be affixed onto the OLED layer. For example, a very thin adhesive layer (approximately 10 microns) may be used to bond very thin glass that is 150 microns thick, so that the distance between the OLED pixel layer and the LC lens layer is about 0.16 mm. Therefore, an optimum distance for observing the auto-stereoscopic display may be reduced from 2700 mm to about 300 mm (assuming that an OLED sub-pixel is the same as an LCD sub-pixel in size).

Figure 5:
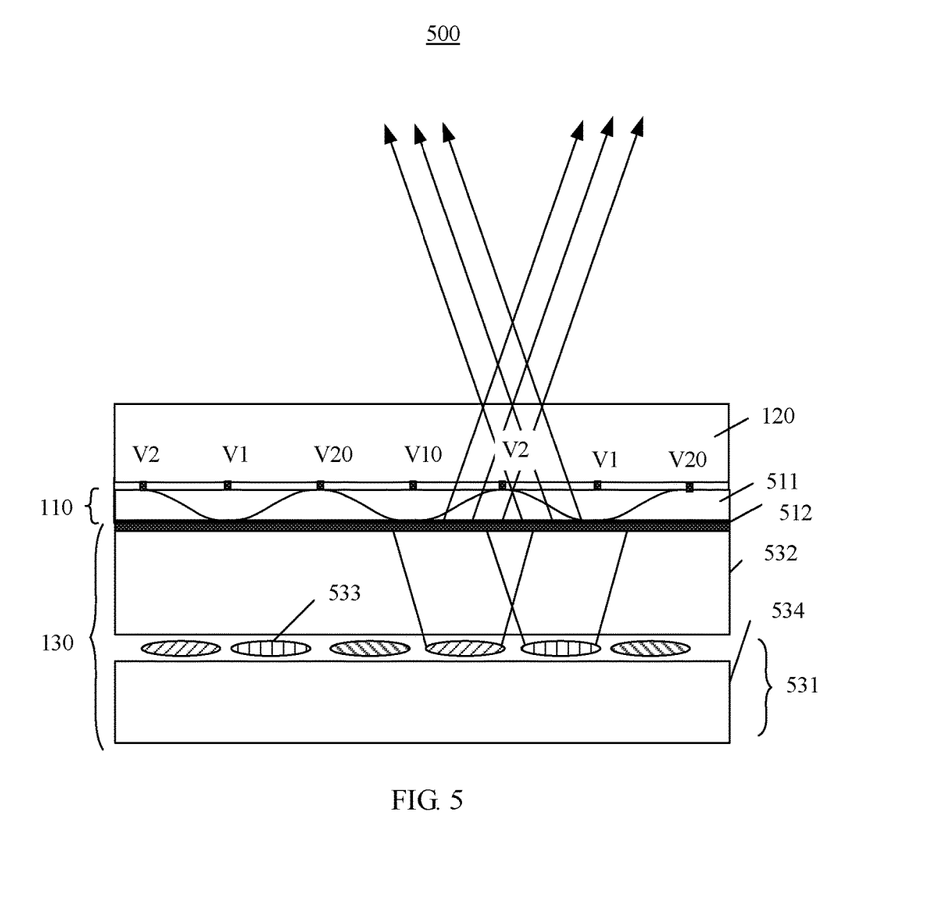
FIG. 5 is a schematic structural diagram of a stereoscopic imaging apparatus according to another embodiment of the present invention.

FIG. 5 is a schematic structural diagram of a stereoscopic imaging apparatus 500 according to another embodiment of the present invention. The stereoscopic imaging apparatus 500 is an example of the stereoscopic imaging apparatus 100, and includes: a display module 130, a second substrate 120, and a first lens layer 110, detailed description of which is omitted herein. The stereoscopic imaging apparatus 500 may be an organic light emitting diode OLED display.

In this embodiment, the display module 130 includes a first substrate 532 and a display pixel layer 531. The display pixel layer 531 includes: a third substrate 534 and an OLED layer 533, where the OLED layer 533 is disposed between the third substrate 534 and the first substrate 532.

In this embodiment, the liquid crystal lens has a structure in which liquid crystal molecules are aligned in parallel with (Planar alignment) the glass substrate. The stereoscopic imaging apparatus 500 needs to include a conductive film 512, the conductive film is grounded, and the conductive film is disposed on a side that is of the first substrate and close to the liquid crystal material; in a first time segment, a voltage is applied to the electrode V1 and the electrode V10, and no voltage is applied to the electrode V2 and the electrode V20 or the electrode V2 and the electrode V20 are grounded; and in a second time segment, a voltage is applied to the electrode V2 and the electrode V20, and no voltage is applied to the electrode V1 and the electrode V10 or the electrode V1 and the electrode V10 are grounded.

In this embodiment, the OLED is a self-luminous component, and different OLEDs can emit light of different colors. Therefore, no backlight or the color filter layer is required.

The first substrate 432 is a bottom glass substrate of the first lens layer, and its thickness is approximately 50-300 microns, such as 150 microns, and may be used as protective glass of the OLED. The glass substrate may be affixed onto the OLED layer. For example, a very thin adhesive layer (approximately 10 microns) may be used to bond very thin glass that is 150 microns thick, so that the distance between the OLED pixel layer and the LC lens layer is about 0.16 mm. Therefore, an optimum distance for observing the auto-stereoscopic display may be reduced from 2700 mm to about 300 mm (assuming that an OLED sub-pixel is the same as an LCD sub-pixel in size).

Figure 6:
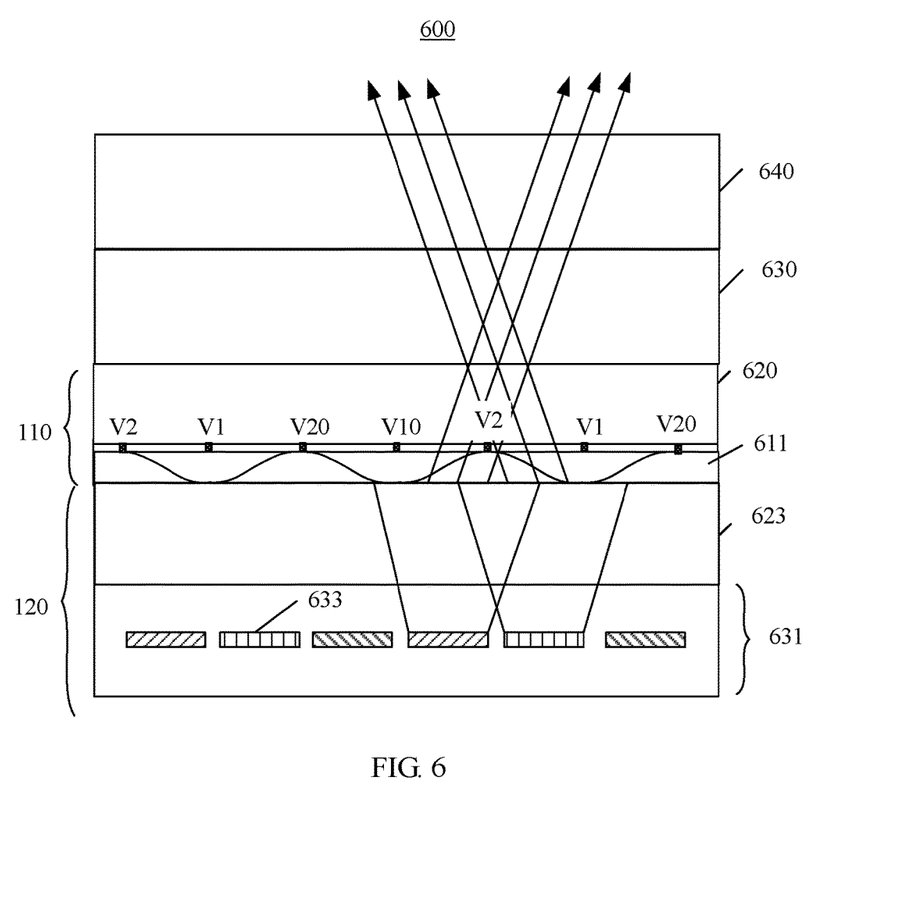
FIG. 6 is a schematic structural diagram of a stereoscopic imaging apparatus according to another embodiment of the present invention.
Figure 7:
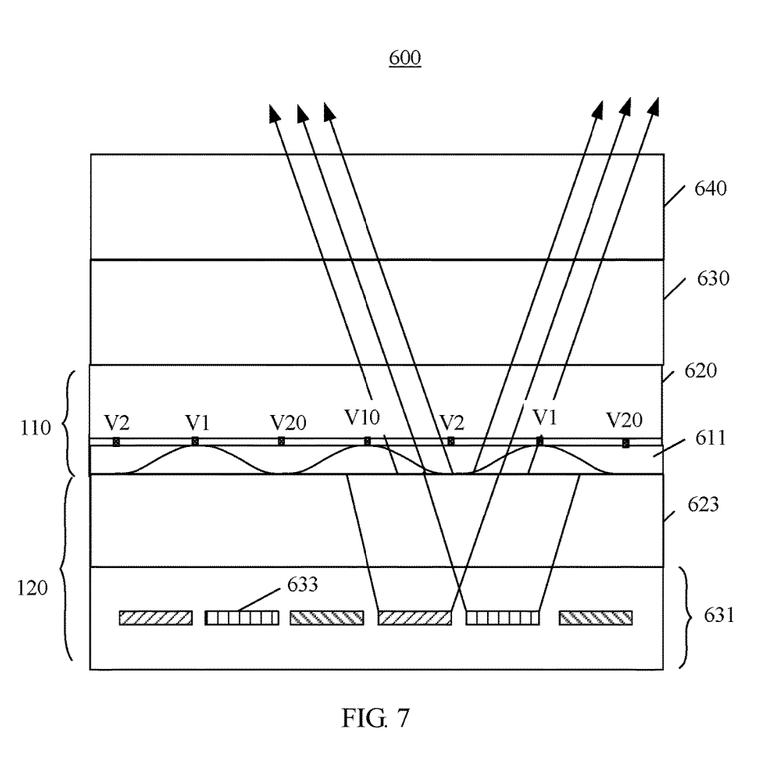
FIG. 7 is a schematic structural diagram of a stereoscopic imaging apparatus according to another embodiment of the present invention.

FIG. 6 is a schematic structural diagram of a stereoscopic imaging apparatus 600 in a first time segment according to another embodiment of the present invention. FIG. 7 is a schematic structural diagram of a stereoscopic imaging apparatus 600 in a second time segment according to another embodiment of the present invention. The stereoscopic imaging apparatus 600 may be an example of the stereoscopic imaging apparatuses 200, 300, 400, and 500.

The stereoscopic imaging apparatus 600 further includes a touchscreen 630 and protective glass 640. The touchscreen 630 is disposed on the second substrate 120, and the protective glass 640 is disposed on the touchscreen 630. That is, the lens layer 110 is disposed between the touchscreen 630 and the display pixel layer 631.

Referring to FIG. 6, an example in which one liquid crystal lens is corresponding to two sub-pixels is used. In a first time segment, a voltage is applied to the electrode V1, the electrode V10 is grounded, no voltage is applied to the electrode V2 and the electrode V20, and beams transmitted by the first sub-pixel and the second sub-pixel are projected by the liquid crystal lens to a left-eye direction and a right-eye direction respectively. Referring to FIG. 7, in a second time segment, a voltage is applied to the electrode V2, the electrode V20 is grounded, no voltage is applied to the electrode V1 and the electrode V10, and beams transmitted by the first sub-pixel and the second sub-pixel are projected by the liquid crystal lens to the right-eye direction and the left-eye direction respectively.

Figure 8:
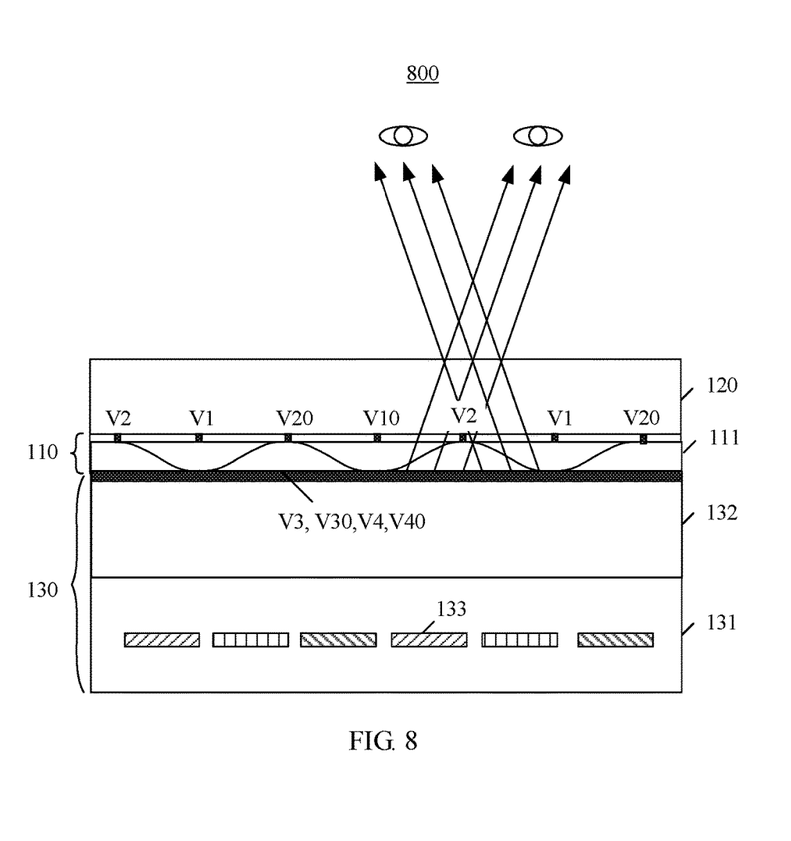
FIG. 8 is a schematic structural diagram of a stereoscopic imaging apparatus according to another embodiment of the present invention.
Figure 9:
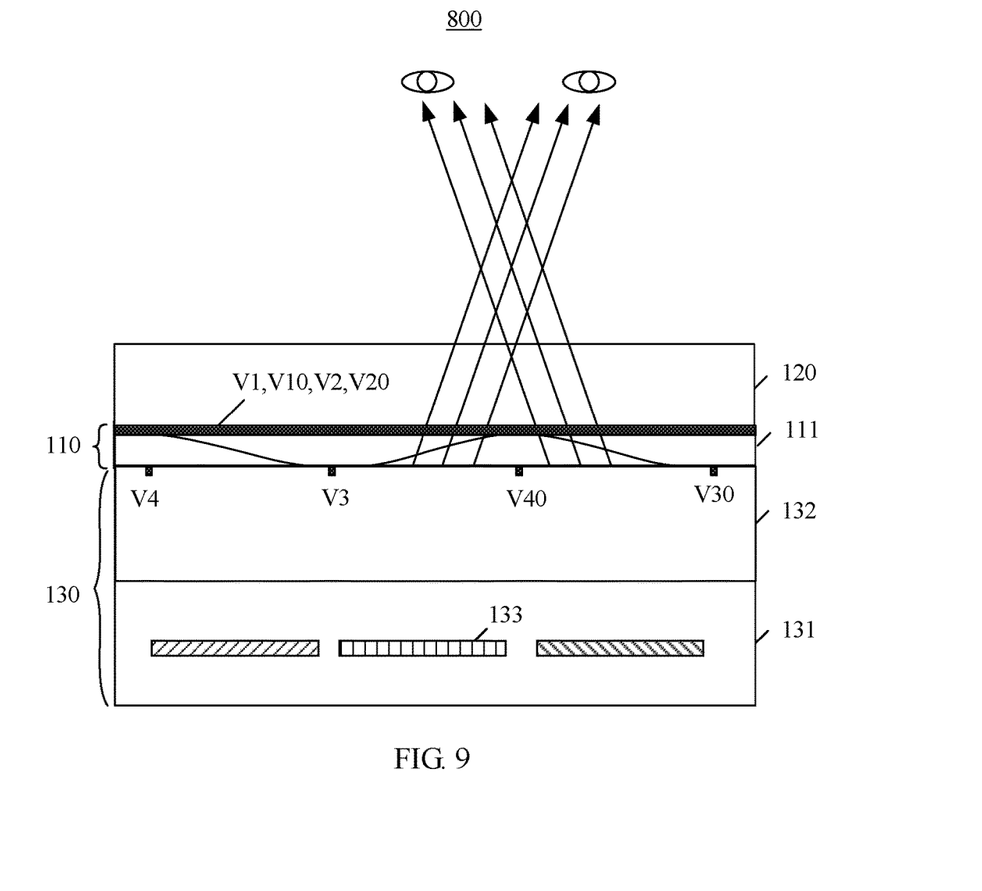
FIG. 9 is a schematic structural diagram of a stereoscopic imaging apparatus according to another embodiment of the present invention.

FIG. 8 is a schematic diagram of a cross section that is of a stereoscopic imaging apparatus 800 and vertical to a longitudinal axis according to another embodiment of the present invention; and FIG. 9 is a schematic diagram of a cross section that is of a stereoscopic imaging apparatus 800 and vertical to a lateral axis according to another embodiment of the present invention.

Referring to FIG. 8, a first electrode V1, an electrode V10 paired with the first electrode V1, a second electrode V2, and an electrode V20 paired with the second electrode V2 are disposed on a second substrate 120 horizontally along the stereoscopic imaging apparatus 800; and when the stereoscopic imaging apparatus 800 is used vertically, the electrode V1, the electrode V10, the electrode V2, and the electrode V20 control a liquid crystal lens in the lens array to deflect the light, which is transmitted by the corresponding pixel in the pixel array 133, to a different projection direction to implement stereoscopic parallax when the stereoscopic imaging apparatus 800 is used vertically. Specifically, the electrode V1, the electrode V10, the electrode V2, and the electrode V20 are in strip shapes, and the electrode V1, the electrode V10, the electrode V2, and the electrode V20 are parallel with each other and extend vertically.

Referring to FIG. 9, the lens array 111 further includes a third electrode V3, an electrode V30 paired with the third electrode V3, a fourth electrode V4, and an electrode V40 paired with the fourth electrode V4 that are disposed alternately; the third electrode V3, the electrode V30, the fourth electrode V4, and the electrode V40 are disposed on the first substrate 132 vertically along the stereoscopic imaging apparatus 800; and when the stereoscopic imaging apparatus 800 is used horizontally, the electrode V3, the electrode V30, the electrode V4, and the electrode V40 control a liquid crystal lens in the lens array to deflect the light, which is transmitted by the corresponding pixel in the pixel array 133, to a different projection direction to implement stereoscopic parallax when the stereoscopic imaging apparatus 800 is used horizontally. Specifically, the electrode V3, the electrode V30, the electrode V4, and the electrode V40 are in strip shapes, and the electrode V3, the electrode V30, the electrode V4, and the electrode V40 are parallel with each other and extend horizontally.

For example, the liquid crystal lens array may be a VA structure, and the electrodes may be driven in an IPS mode.

The stereoscopic imaging apparatus can detect whether the stereoscopic imaging apparatus is currently used vertically or used horizontally. When a user uses the stereoscopic imaging apparatus vertically, the electrode V1, the electrode V10, the electrode V2, and the electrode V20 control deflection of the liquid crystal lens; and when the user uses the stereoscopic imaging apparatus horizontally, the electrode V3, the electrode V30, the electrode V4, and the electrode V40 control deflection of the liquid crystal lens instead. In this way, the user can obtain an auto-stereoscopic display effect no matter whether the stereoscopic imaging apparatus is used vertically or horizontally.

According to this embodiment of the present invention, the electrode V3, the electrode V30, the electrode V4, and the electrode V40 may be made of conductive ink (conductive ink). The conductive ink may be coat on a substrate (such as a substrate of the polarizer, the protective glass, or the display pixel layer) between the liquid crystal lens layer and the pixel display layer. The ITO on the substrate between the liquid crystal lens layer and the pixel display layer serves as a first set of electrodes, and the ITO on the substrate of the liquid crystal lens serves as a second set of electrodes. The two sets of electrodes may drive the liquid crystal lens layer of a VA structure in an IPS drive mode. The two sets of electrodes are vertical to each other, and naked-eye 3D can be implemented no matter whether the stereoscopic imaging apparatus is used horizontally or vertically. The liquid crystal lens layer is designed thick enough (for example, greater than dozens of microns), and therefore the electric field generated by a set of electrodes is not affected by existence of another set of electrodes, and a steering speed of in the IPS driving is not affected by a thickness of the liquid crystal lens layer.

According to this embodiment of the present invention, the liquid crystal lens may be a VA structure, and the two sets of electrodes may be driven in an IPS mode. The two sets of electrodes are vertical to each other, and are consistent with vertical and horizontal use directions of the mobile phone respectively. Because a thickness of the liquid crystal lens is greater than dozens of microns, the electric field generated by a set of electrodes is not affected by existence of another set of electrodes. The stereoscopic imaging apparatus is generally designed to implement auto-stereoscopic display when being used horizontally. In this way, a vertical distance ($d_y$ in FIG. 10) between a liquid crystal lens center on the display pixel layer (such as the color filter layer) and a sub-pixel center on a color filter is relatively great. Because the sub-pixel on the color filter is rectangular when the stereoscopic imaging apparatus is used horizontally, an appropriate steering angle can be accomplished even if the liquid crystal lens layer is not very close to the pixel display layer, and a problem of crosstalk is not very obvious. However, when the stereoscopic imaging apparatus is used vertically, a diameter of the liquid crystal lens is about ⅓ of a diameter of the liquid crystal lens of the stereoscopic imaging apparatus used horizontally. In this case, a very small distance is required between the LC lens layer and the CF layer to enable watching of the auto-stereoscopic display from a place at a distance of about 300 mm, and effects of reducing crosstalk and improving brightness are achieved additionally. This embodiment of the present invention meets a requirement about the distance between the LC lens layer and the CF layer when the stereoscopic imaging apparatus is used vertically.

An embodiment of the present invention further provides a terminal. The terminal includes a stereoscopic imaging apparatus according to any one of the foregoing embodiments.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A stereoscopic imaging apparatus, comprising:
a display module, comprising a display pixel layer and a first substrate wherein the display pixel layer comprises a pixel array, and the first substrate is disposed on the display pixel layer;
a second substrate, disposed opposite to the first substrate; and
a first lens layer, comprising a lens array, wherein the first lens layer is disposed between the first substrate and the second substrate, and the lens array is configured to receive light transmitted by the pixel array, and deflect light, which is transmitted by a corresponding pixel in the pixel array, to a different projection direction to implement stereoscopic parallax,
wherein the lens array comprises a first electrode, an electrode paired with the first electrode, a second electrode, and an electrode paired with the second electrode that are disposed alternately, and a liquid crystal material, and the lens array is configured to receive light transmitted by the pixel array, and control a liquid crystal lens in the lens array to deflect light, which is transmitted by a pixel in the pixel array, to a different projection direction to implement stereoscopic parallax,
wherein the first electrode, the electrode paired with the first electrode the second electrode, and the electrode paired with the second electrode are disposed in parallel on a side that is of the second substrate and close to the liquid crystal material; in a first time segment, a voltage is applied to the first electrode, the electrode paired with the first electrode is grounded, and no voltage is applied to the second electrode and the electrode paired with the second electrode; and in a second time segment, a voltage is applied to the second electrode, the electrode paired with the second electrode is grounded, and no voltage is applied to the first electrode and the electrode paired with the first electrode.

2. The stereoscopic imaging apparatus according to claim 1, wherein the stereoscopic imaging apparatus is a liquid crystal display LCD, the display module further comprises a first polarizer, wherein the first polarizer is disposed between the first substrate and the first lens layer, and the display pixel layer comprises: a second polarizer, a display liquid crystal layer, and a color filter layer, wherein the color filter layer is disposed between the display liquid crystal layer and the first substrate, and the display liquid crystal layer is disposed between the color filter layer and the second polarizer.

3. The stereoscopic imaging apparatus according to claim 2, wherein a thickness of the first substrate is 50-300 microns.

4. The stereoscopic imaging apparatus according to claim 1, wherein the stereoscopic imaging apparatus is a liquid crystal display LCD, and the display pixel layer comprises: a first polarizer, a second polarizer, a display liquid crystal layer, a third substrate, a color filter layer, wherein the color filter layer is disposed between the first substrate and the third substrate, the third substrate is disposed between the color filter layer and the first polarizer, the display liquid crystal layer is disposed between the first polarizer and the second polarizer.

5. The stereoscopic imaging apparatus according to claim 4, wherein the first substrate is protective glass of the color filter layer, and a thickness of the protective glass is 50-300 microns.

6. The stereoscopic imaging apparatus according to claim 1, wherein the stereoscopic imaging apparatus is an organic light emitting diode (OLED) display, and the display pixel layer comprises: a third substrate and an (OLED) layer, wherein the OLED layer is disposed between the third substrate and the first substrate.

7. The stereoscopic imaging apparatus according to claim 6, wherein a thickness of the first substrate is 50-300 microns.

8. The stereoscopic imaging apparatus according to claim 1, wherein the first electrode, the electrode paired with the first electrode, the second electrode, and the electrode paired with the second electrode are disposed on the second substrate horizontally along the stereoscopic imaging apparatus; and when the stereoscopic imaging apparatus is used vertically, the first electrode, the electrode paired with the first electrode, the second electrode, and the electrode paired with the second electrode control the liquid crystal lens in the lens array to deflect the light, which is transmitted by the corresponding pixel in the pixel array, to a different projection direction to implement stereoscopic parallax.

9. The stereoscopic imaging apparatus according to claim 8, wherein the lens array further comprises a third electrode, an electrode paired with the third electrode, a fourth electrode, and an electrode paired with the fourth electrode that are disposed alternately; the third electrode, the electrode paired with the third electrode, the fourth electrode, and the electrode paired with the fourth electrode are disposed on the first substrate vertically along the stereoscopic imaging apparatus; and when the stereoscopic imaging apparatus is used horizontally, the third electrode, the electrode paired with the third electrode, the fourth electrode, and the electrode paired with the fourth electrode control the liquid crystal lens in the lens array to deflect the light, which is transmitted by the corresponding pixel in the pixel array, to a different projection direction to implement stereoscopic parallax.

10. The stereoscopic imaging apparatus according to claim 9, wherein the third electrode, the electrode paired with the third electrode, the fourth electrode, and the electrode paired with the fourth electrode are made of conductive ink.

11. The stereoscopic imaging apparatus according to claim 1, further comprising:
a touchscreen, disposed on the second substrate; and
a protective glass, disposed on the touchscreen.

12. The stereoscopic imaging apparatus according to claim 1, wherein the pixel array comprises multiple pixels, the lens array comprises multiple first lenses, and each first lens in the multiple first lenses is corresponding to at least one pixel.

13. The stereoscopic imaging apparatus according to claim 1, wherein the pixel array comprises multiple pixels, the lens array comprises multiple first lenses, each pixel in the multiple pixels comprises multiple sub-pixels, and each first lens in the multiple first lenses is corresponding to at least one sub-pixel.

14. A user terminal, comprising a stereoscopic imaging apparatus according to claim 1.

15. A stereoscopic imaging apparatus, comprising:
a display module, comprising a display pixel layer and a first substrate, wherein the display pixel layer comprises a pixel array, and the first substrate is disposed on the display pixel layer;
a second substrate, disposed opposite to the first substrate; and
a first lens layer, comprising a lens array, wherein the first lens layer is disposed between the first substrate and the second substrate, and the lens array is configured to receive light transmitted by the pixel array, and deflect light, which is transmitted by a corresponding pixel in the pixel array, to a different projection direction to implement stereoscopic parallax,
wherein the lens array comprises a first electrode, an electrode paired with the first electrode, a second electrode, and an electrode paired with the second electrode that are disposed alternately, and a liquid crystal material, and the lens array is configured to receive light transmitted by the pixel array, and control a liquid crystal lens in the lens array to deflect light, which is transmitted by a pixel in the pixel array, to a different projection direction to implement stereoscopic parallax, wherein the stereoscopic imaging apparatus further comprises a conductive film, the conductive film is grounded, and the conductive film is disposed on a side that is of the first substrate and close to the liquid crystal material; in a first time segment, a voltage is applied to the first electrode and the electrode paired with the first electrode, and no voltage is applied to the second electrode and the electrode paired with the second electrode or the second electrode and the electrode paired with the second electrode are grounded; and in a second time segment, no voltage is applied to the first electrode and the electrode paired with the first electrode or the first electrode and the electrode paired with the first electrode are grounded, and a voltage is applied to the second electrode and the electrode paired with the second electrode.

16. A user terminal, comprising a stereoscopic imaging apparatus according to claim 15.

17. The stereoscopic imaging apparatus according to claim 15, further comprising:
a touchscreen, disposed on the second substrate; and
a protective glass, disposed on the touchscreen.

* * * * *